United States Patent
Asakura et al.

(10) Patent No.: US 8,183,502 B2
(45) Date of Patent: May 22, 2012

(54) MOUNTING TABLE STRUCTURE AND HEAT TREATMENT APPARATUS

(75) Inventors: Kentaro Asakura, Nirasaki (JP); Hiroo Kawasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 507 days.

(21) Appl. No.: 12/334,119

(22) Filed: Dec. 12, 2008

(65) Prior Publication Data

US 2009/0095731 A1    Apr. 16, 2009

Related U.S. Application Data

(63) Continuation of application No. PCT/JP2007/061547, filed on Jun. 7, 2007.

(30) Foreign Application Priority Data

Jun. 12, 2006   (JP) .................................. 2006-161758

(51) Int. Cl.
*F27D 11/00* (2006.01)
*C23C 16/00* (2006.01)

(52) U.S. Cl. ..................... 219/438; 219/433; 219/443.1; 219/444.1; 219/390; 219/405; 219/411; 118/724; 118/725; 118/728; 118/729; 118/730; 118/50.1

(58) Field of Classification Search .................. 219/438, 219/433, 443.1, 444.1, 390, 405, 411; 118/725–5, 118/728–30, 50.1

See application file for complete search history.

(56) References Cited

U.S. PATENT DOCUMENTS

| | | | |
|---|---|---|---|
| 5,685,949 A | 11/1997 | Yashima | |
| 6,110,274 A | 8/2000 | Okuno | |
| 2006/0199131 A1 | 9/2006 | Kawasaki et al. | |

FOREIGN PATENT DOCUMENTS

| | | | |
|---|---|---|---|
| JP | 63-098119 A | | 4/1988 |
| JP | 2-070066 A | | 3/1990 |
| JP | 8-250488 A | | 9/1996 |
| JP | 11-021120 A | | 1/1999 |
| JP | 2001-102435 A | | 4/2001 |
| JP | 2004-356624 | * | 12/2004 |
| JP | 2004-356624 A | | 12/2004 |

* cited by examiner

*Primary Examiner* — Shawntina Fuqua
(74) *Attorney, Agent, or Firm* — Oblon, Spivak, McClelland, Maier & Neustadt, L.L.P.

(57) ABSTRACT

A mounting table structure arranged in a processing chamber is provided for mounting a target object to be processed on the upper surface. The mounting table structure is characterized in having a mounting table wherein a heating unit are embedded to heat the target object to perform a specified heat treatment to the target object, and a supporting column which stands on the bottom portion of the processing chamber and supports the mounting table. The mounting table structure is also characterized in that a heat-equalizing member spread in a planar direction is embedded above the heating unit in the mounting table.

13 Claims, 7 Drawing Sheets

MOUNTING TABLE STRUCTURE AND HEAT TREATMENT APPARATUS

This application is a Continuation Application of PCT International Application No. PCT/JP2007/061547 filed on Jun. 7, 2007, which designated the United States.

FIELD OF THE INVENTION

The present invention relates to a mounting table structure of a target object such as a semiconductor wafer or the like and a heat treatment apparatus.

BACKGROUND OF THE INVENTION

Generally, in order to manufacture a semiconductor integrated circuit, various single wafer processes such as a film forming process, an etching process, a heat treating process, a quality modification process and a crystallization process are repeatedly performed on a target object, e.g., a semiconductor wafer or the like. As a consequence, a required integrated circuit is formed. While executing such processes, processing gases needed for the corresponding processes, e.g., a film formation gas for the film forming process; ozone gas or the like for the quality modification process; $O_2$ gas, an inert gas such as $N_2$ gas, or the like for the crystallization process, are respectively introduced into a processing chamber. For example, in a single wafer processing apparatus for performing heat treatment on semiconductor wafers one by one, a mounting table incorporating therein, e.g., a resistance heater, is installed in a vacuum evacuable processing chamber. Next, a predetermined processing gas is introduced into the processing chamber after mounting a semiconductor wafer on the mounting table to apply various heat treatments on the wafer under predetermined process conditions (see, Japanese Patent Laid-open Applications No. S63-278322, No. H07-078766, No. H06-260430 and No. 2004-356624).

A mounting table structure for mounting thereon a wafer in a processing chamber is generally manufactured by thermally bonding a mounting table together with a supporting column through, e.g., thermal diffusion bond technique. The mounting table is formed by embedding a resistance heater as a heating element in a ceramic material such as AlN or the like and then sintering them as a unit at a high temperature to ensure heat-resistance and corrosion-resistance and preventing metal contamination. The supporting column is also formed by sintering a ceramic material or the like in another process. The mounting table structure formed as a unit with the supporting column stands on a bottom portion of the processing chamber.

In a mounting table made of quartz glass, a resistance heater is embedded between two quartz glass plates and, then, they are press-welded at a high temperature, thereby forming a mounting table where the heater is embedded. Next, a column made of quartz glass is press-welded on a backside of the mounting table at a high temperature to thereby have the mounting table structure to be manufactured.

In the mounting table made of quartz glass, the arrangement pattern of the resistance heater is directly reflected as heat rays on the backside of the wafer due to the comparative transparency of the quartz glass, so that the in-plane temperature uniformity in the wafer may deteriorate. Generally, in order to prevent the deterioration of the in-plane temperature uniformity in the wafer, a thin board-shaped opaque heat-equalizing plate made of a ceramic plate such as SiC, AlN or the like is mounted on the top surface of the mounting table. The wafer is directly mounted on the top surface of the heat-equalizing plate, and then is heated thereon.

However, when the heat-equalizing plate is installed on the mounting table, it is not possible to prevent a processing gas from flowing into a narrow gap formed between a top surface of the mounting table and a bottom surface of the heat-equalizing plate during the treatment of the wafer. Especially when a film forming process is performed, a film forming gas flows into the narrow gap and, hence, an unnecessary attachment film causing particles is deposited thereon. The presence of the unnecessary attachment film causes radiant heat of the heat-equalizing plate to be changed, thereby deteriorating the in-plane temperature uniformity in the wafer.

Moreover, since the wafer is mounted on the mounting table via the heat-equalizing plate, contact heat resistance between solid surfaces lowers thermal conductivity. That is, the heating efficiency of the wafer is decreased. Furthermore, in the above mounting table structure, the mounting table cannot serve as a lower electrode, so that a high frequency power cannot be applied even if the high frequency needs to be supplied to perform the plasma processing.

SUMMARY OF THE INVENTION

In view of the above, the present invention provides a mounting table structure and a heat treatment apparatus which are capable of improving in-plane temperature uniformity in a target object and increasing heating efficiency of the target object.

In accordance with one aspect of the invention, there is provided a mounting table structure arranged in a processing chamber, including: a mounting table for mounting a target object on an upper surface thereof, a heating unit being embedded in the mounting table for heating the target object to perform a specified heating treatment; and a supporting column for supporting the mounting table, the supporting column being standing on a bottom portion of the processing chamber. Also, a heat-equalizing member spread in a planar direction is embedded above the heating unit in the mounting table.

In accordance with the above characteristics, it is possible to improve the in-plane temperature uniformity in the target object extremely effectively, and also possible to increase the heating efficiency of the target object extremely effectively.

In accordance with another aspect of the invention, there is provided a mounting table structure arranged in a processing chamber, including: a mounting table for mounting a target object on an upper surface thereof; and a supporting column for supporting the mounting table, the supporting column being standing on a bottom portion of the processing chamber. Also, a heat-equalizing member spread in a planar direction is embedded in the mounting table, the heat-equalizing member being made of a material conductive to high frequency. A conductive line is connected to the heat-equalizing member, and the conductive line is inserted in the supporting column.

In accordance with the above characteristics, the in-plane temperature uniformity in the target object can be increased extremely effectively. Moreover, the mounting table can serve as a lower electrode by connecting the conductive line to the heat-equalizing member. That is, it is possible to perform plasma processing by applying a high frequency power to the lower electrode.

Further, when the conductive line is grounded, the heat-equalizing member can serve as a shield for preventing a discharge from, e.g., a heating unit (heating element) with respect to a high frequency wave (plasma).

It is preferable that a heating unit spread in a planar direction is embedded below the heat-equalizing member in the mounting table.

Further, the mounting table and the supporting column may be made of a heat-resistant and corrosion-resistant insulating material. More particularly, the heat-resistant and corrosion-resistant material may be quartz glass or ceramic.

The heat-equalizing member may preferably be formed of a plurality of wires arranged in a mesh shape, and materials forming the mounting table are projected and coupled to each other in net hole-shaped portions formed by the wires. Therefore, it is possible to increase the contact area between materials forming the mounting table. Accordingly, strength of the mounting table itself can be maintained at a high level.

The heat-equalizing member may also preferably be formed as a punch plate where a plurality of punch holes are formed, and materials forming the mounting table are projected and coupled to each other in the punch holes. Accordingly, it is possible to increase the contact area between materials forming the mounting table and, hence, strength of the mounting table itself can be maintained at a high level.

Furthermore, the heat-equalizing member may be made of carbon or a semiconductor material.

Also, the supporting column may be formed in a cylindrical shape, and an inner space of the supporting column may be filled with the atmosphere where a high frequency discharge is prevented.

It is preferable that the mounting table may have on an entire surface thereof a coolant channel through which a coolant for cooling the mounting table flows, and a coolant line may be provided in the supporting column for supplying the coolant to the coolant channel. Thus, the temperature of the mounting table can be quickly lowered to a required temperature by supplying the coolant in the coolant channel of the mounting table when necessary. As a result, the throughput can be improved.

Further, the coolant may be gas or liquid. As for the coolant, gas and liquid may be alternately used depending on a temperature of the mounting table.

In accordance with still another aspect of the invention, there is provided a heat treatment apparatus including: a vacuum evacuable processing chamber; the mounting table structure described in the above; and a gas supply unit for supplying a specified processing gas to the processing chamber.

It is preferable that the processing chamber may have therein an electrode connected to a high frequency power for generating a plasma.

DETAILED DESCRIPTION OF THE EMBODIMENT

Embodiments of a mounting table structure and a heat treatment apparatus in accordance with the present invention will be described with reference to the accompanying drawings which form a part hereof.

Figure 1:
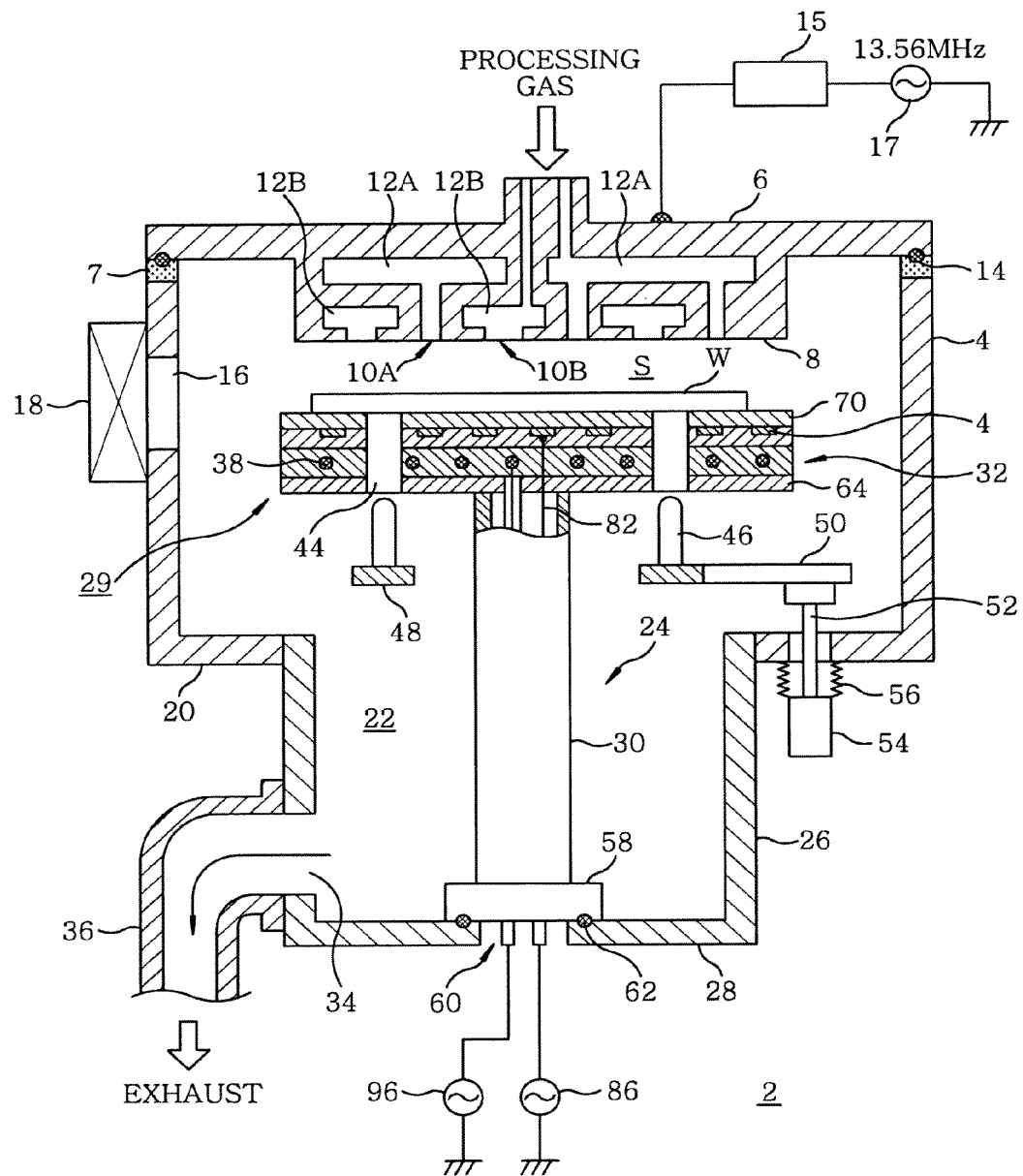
FIG. 1 shows a schematic cross sectional view of an embodiment of a heat treatment apparatus in accordance with the present invention.
Figure 2:
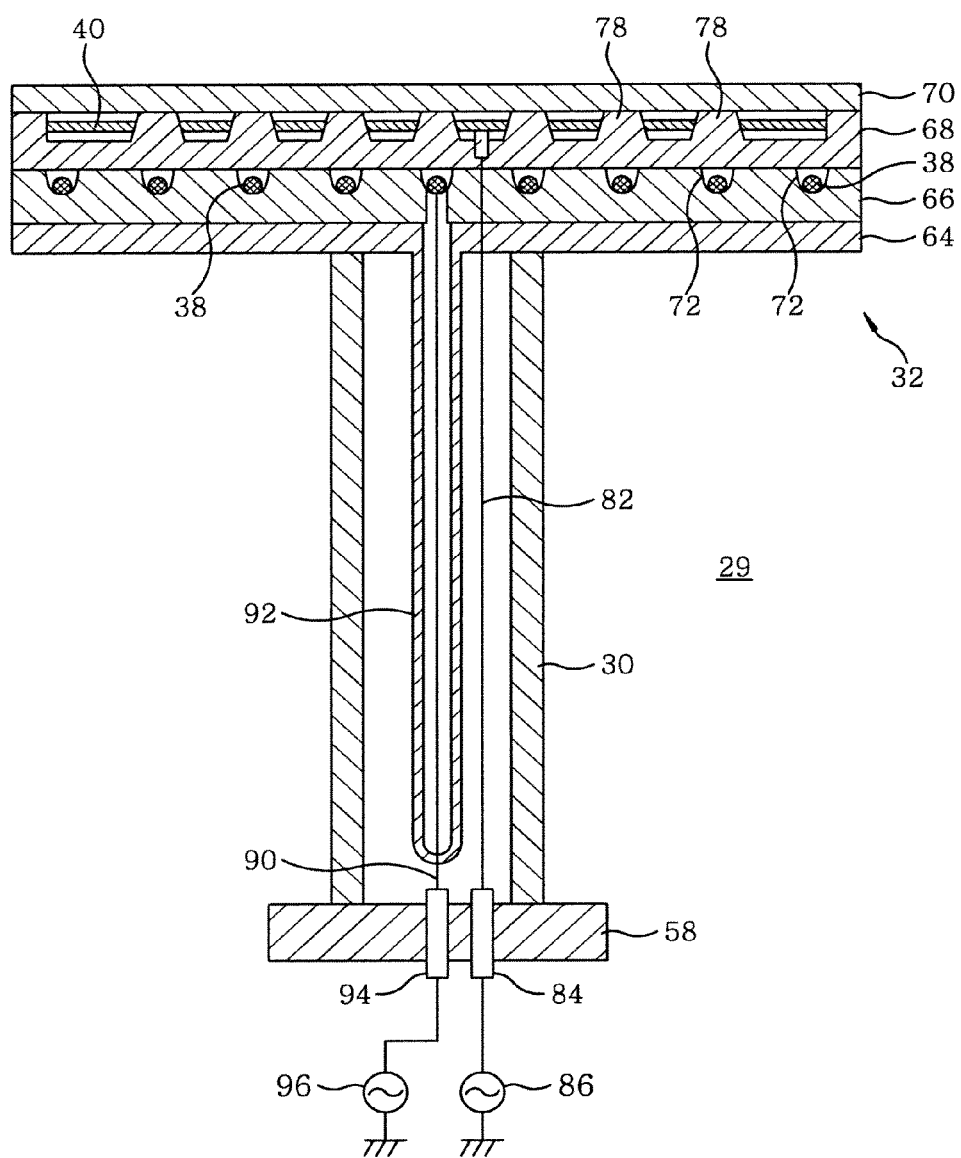
FIG. 2 describes a schematic cross sectional view of an embodiment of a mounting table structure in accordance with the present invention.
Figure 3:
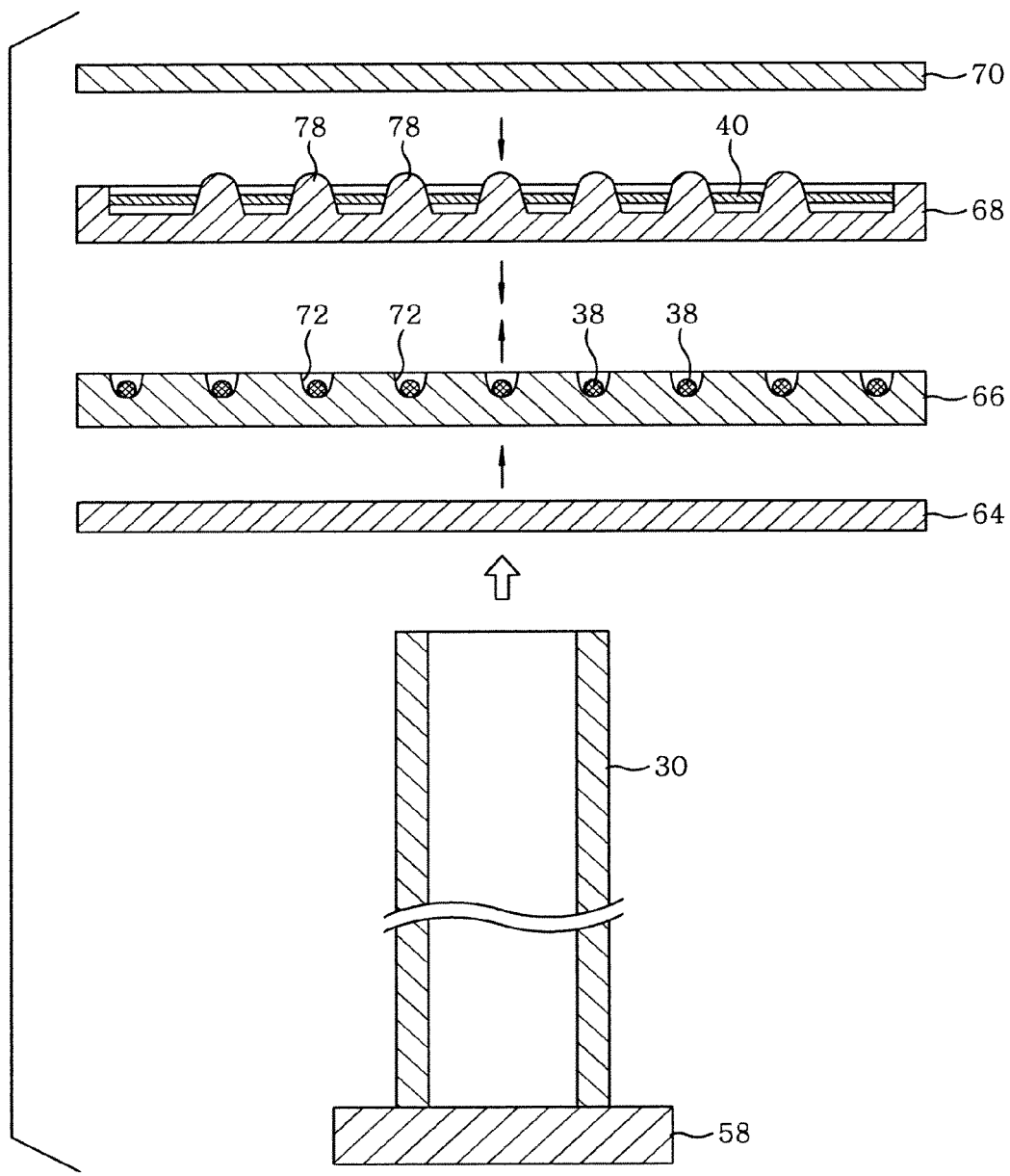
FIG. 3 provides a schematic assembly view illustrating an assembly state of the mounting table structure of FIG. 2.
Figure 4:
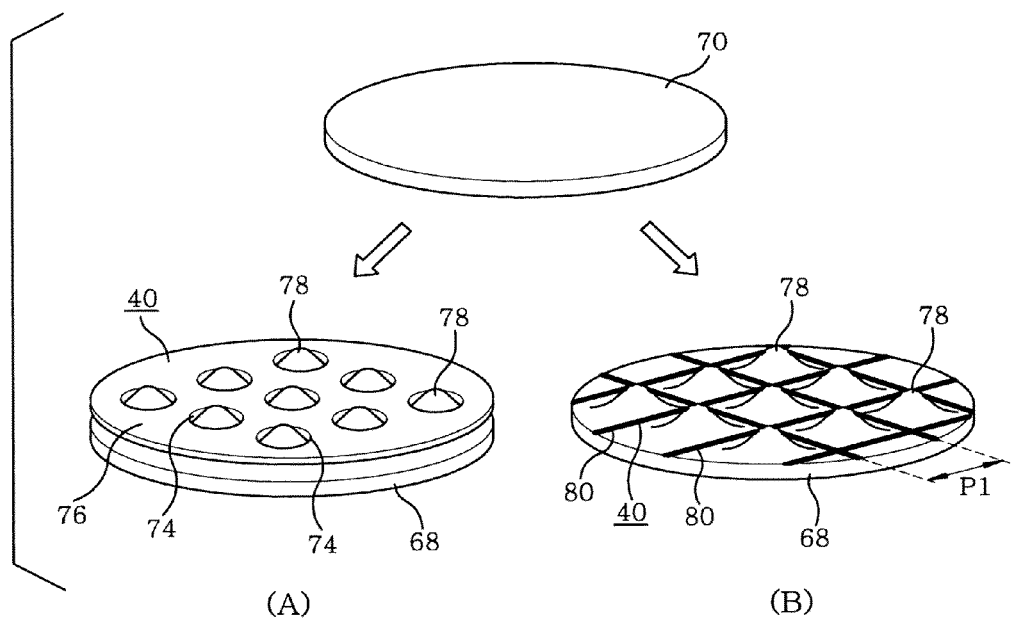
FIG. 4 is an explanatory view for explaining embodiment types of a heat-equalizing member.

FIG. 1 shows a schematic cross sectional view of an embodiment of a heat treatment apparatus in accordance with the present invention; FIG. 2 describes a schematic cross sectional view of an embodiment of a mounting table structure in accordance with the present invention; FIG. 3 provides a schematic assembly view illustrating an assembly state of the mounting table structure of FIG. 2; and FIG. 4 is an explanatory view for explaining embodiment types of a heat-equalizing member. The heat treatment apparatus of this embodiment can utilize a plasma generated by a high frequency electric power.

As shown in FIG. 1, a heat treatment apparatus 2 of this embodiment has a processing chamber 4 made of aluminum, and an inside of the processing chamber 4 is approximately of a cylindrical shape. Installed via an insulating layer 7 on a ceiling portion of the processing chamber 4 is a shower head 6 serving as a gas supply unit for introducing a required processing gas, e.g., a film forming gas. A gas injection surface 8 on a bottom surface of the shower head 6 has a plurality of gas injection holes 10A and 10B, so that the processing gas is injected through the gas injection holes 10A and 10B toward a processing space S.

Two partitioned gas diffusion spaces 12A and 12B of a hollow shape are formed inside the shower head 6. The processing gas introduced therein is diffused in a planar direction, and then is ejected through gas injection holes 10A and 10B respectively communicating with the gas diffusion spaces 12A and 12B. That is, the gas injection holes 10A and 10B are arranged in a matrix shape. Meanwhile, a single gas diffusion space can be formed in the shower head 6.

The entire shower head 6 is formed of, e.g., nickel, a nickel alloy of Hastelloy (registered trademark) or the like, aluminum or an aluminum alloy.

A sealing member 14 formed of, e.g., an O-ring or the like, is provided at an abutment of the shower head 6 and an insulating layer 7 in an open top of the processing chamber 4. Accordingly, the inside of the processing chamber 4 is maintained airtight.

The shower head 6 serves as an upper electrode during plasma processing. To be specific, a high frequency power supply 17 supplying a frequency of, e.g., 13.56 MHz, for plasma generation is connected to the shower head 6 via a matching circuit 15. Thus, a plasma can be generated when needed. Further, the frequency is not limited to 13.56 MHz.

Formed on a sidewall of the processing chamber 4 is a loading/unloading port 16 for loading and unloading a target object, e.g., a semiconductor wafer W, into and from the processing chamber 4. Installed at the loading/unloading port 16 is a gate valve 18 capable of being airtightly opened and closed.

Further, an exhaust gas downdraft space 22 is formed at a bottom portion 20 of the processing chamber 4. Specifically, a large opening 24 is provided at a central portion of the bottom portion 20 of the processing chamber 4, and the entrance opening 24 is connected to a downwardly extending cylindrical partition wall 26 of a cylindrical shape having a bottom surface. Accordingly, an inner space of the cylindrical partition wall 26 forms the exhaust gas downdraft space 22.

A mounting table structure 29 as a feature of the present invention is provided to stand on a bottom portion 28 of the cylindrical partition wall 26 defining the exhaust gas downdraft space 22. To be specific, the mounting table structure 29 mainly includes a cylindrical supporting column 30 and a mounting table 32 fixed on top of the supporting column 30. The mounting table structure 29 will be described in detail later.

A diameter of the opening 24 of the exhaust gas downdraft space 22 is set to be smaller than that of the mounting table 32. Thus, a processing gas flowing downward along an outer region of the periphery of the mounting table 32 curves inward under the mounting table 32 and then flows into the opening 24.

An exhaust port 34 is formed on a bottom sidewall of the cylindrical partition wall 26 so as to communicate with the exhaust gas downdraft space 22. The exhaust port 34 is connected to an exhaust line 36 where a vacuum pump (not shown) is installed, so that the atmosphere of the processing chamber 4 and the exhaust gas downdraft space 22 can be exhausted to vacuum.

A pressure control valve (not shown) whose opening can be controlled is installed on the exhaust line 36. By automatically controlling the opening degree of the pressure control valve, a pressure inside the processing chamber 4 can be maintained at a constant level or rapidly changed to a required pressure.

The mounting table 32 is made of a heat-resistant and corrosion-resistant insulating material, e.g., quartz glass or the like. As shown in FIG. 2, a resistance heater 38 formed of, e.g., carbon wire heater arranged in a predetermined pattern, is embedded as a heating unit in the mounting table 32. Further, a heat-equalizing member 40 spread in a planar direction is embedded as a single body above the resistance heater 38.

A semiconductor wafer W as a target object is directly mounted on the mounting table 32. The supporting column 30 for supporting the mounting table 32 is also made of a heat-resistant and corrosion-resistant insulating material, e.g., quartz glass or the like.

The mounting table 32 is provided with a plurality of, e.g., three, pin insertion through holes 44 (only two are shown in FIG. 1, and the illustration thereof is omitted in the other drawings) vertically running therethrough. Inserted through each of the pin insertion through holes 44 is a vertically movable upthrust pin 46. A bottom portion of the upthrust pin 46 is connected to a ring-shaped upthrust ring 48 made of ceramic such as alumina or the like. The lower portion of each upthrust pin 46 is mounted on or coupled to the upthrust ring 48. An arm unit 50 extending from the upthrust ring 48 is connected to an up/down rod 52 passing through the bottom portion 20 of the processing chamber 4, and the up/down rod 52 is configured to be vertically moved by an actuator 54. Accordingly, when the wafer W is exchanged, each upthrust pin 46 is vertically raised above or lowered below a top portion of each pin insertion through hole 44. Moreover, an expansible/contractible bellows 56 is installed at a portion where the up/down rod 52 of the actuator 54 penetrates the bottom portion of the processing chamber. Accordingly, the up/down rod 52 can be vertically moved while keeping the inside of the processing chamber 4 airtight.

The bottom portion of the supporting column 30 of the mounting table structure 29 is closed. Further, a flange 58 having a larger diameter is provided on the corresponding bottom portion. The flange 58 is detachably attached to the bottom portion 28 of the cylindrical partition wall 26, by using bolts (not shown) or the like, to thereby cover a through hole 60 formed at the center of the bottom portion 28 of the cylindrical partition wall 26. Besides, sealing members 62 such as an O-ring or the like are installed between the flange 58 and the bottom portion 28 of the cylindrical partition wall 26 which corresponds to the peripheral portion of the through hole 60. Accordingly, the corresponding portion can be maintained airtight.

Hereinafter, the mounting table structure 29 will be described in detail with reference to FIGS. 2 to 5.

As set forth above, the mounting table structure 29 mainly includes the mounting table 32 and the supporting column 30. To be specific, the mounting table 32 is formed by depositing four circular plate-shaped glass plates made of, e.g., quartz glass, which include a lower plate 64, a middle plate 66, an upper plate 68 and an uppermost plate 70, as can be seen from FIGS. 2 and 3. The middle plate 66 is comparatively thick, and heater groove 72 for accommodating the resistance heater 38 is formed on the entire top surface of the middle plate 66. Further, the resistance heater 38 is accommodated in the heater groove 72. Although it is not illustrated, the resistance heater 38 is divided into a plurality of concentrically shaped regions, and a temperature in each region can be controlled independently.

Furthermore, the heat-equalizing member 40 as the feature of the present invention is embedded between the upper plate 68 and the uppermost plate 70. The four glass plates 64, 66, 68 and 70 are coupled as a unit as shown in FIG. 3 by press-welding them at a high temperature in a state where the resistance heater 38 and the heat-equalizing member 40 are arranged in their corresponding places, thereby forming the mounting table 32. Moreover, one end portion of the cylindrical supporting column 30 formed as a separate member is fusion-bonded to the center of the backside of the mounting table 32, the supporting column 30 being made of a heat-resistant and corrosion-resistant insulating material, e.g., quartz glass. As a consequence, the mounting table structure 29 having a T shaped cross section is manufactured.

The heat-equalizing member 40 is made of a material of high emissivity so that the wafer W can be heated effectively. Here, since a high frequency power is used in the apparatus, the heat-equalizing member 40 is made of a material having conductivity with respect to a high frequency. As for such material, it is possible to use carbon, a silicon substrate, molybdenum, tungsten or the like.

To be specific, as for the heat-equalizing member 40, it is possible to use a punch plate 76 (on the left side of FIG. 4) in which a plurality of punch holes 74 are uniformly formed in a silicon substrate or a carbon plate (sheet), as schematically described in FIG. 4.

In that case, a diameter of the punch plate 76 is set to be slightly smaller than that of the upper plate 68. Moreover, a plurality of mountain-shaped coupling protrusions 78 is formed in advance on the top surface of the upper plate 68. The punch plate 76 is installed by inserting the coupling protrusions 78 into the punch holes 74. Further, the uppermost plate 70 is press-welded thereon.

Accordingly, the upper plate 68 and the uppermost plate 70 are welded in the peripheral portions and, also, the coupling protrusions 78 and the uppermost plate 70 are welded. That is, the materials forming the mounting table 32 are protruded to be coupled with each other inside the punch holes 74. Therefore, the welded area can be increased and, hence, the coupling strength can be enhanced.

As for the heat-equalizing member 40, it is possible to use, instead of the punch plate 76, a structure shown on the right side of FIG. 4, in which the coupling protrusions 78 are disposed in net holes surrounded by wire materials 80 formed of, e.g., carbon wires, arranged in a mesh shape (grid shape).

In that case, the thickness of the wire materials 80 is preferably controlled to, e.g., about 0.5 to 5 mm, more preferably about 0.5 to 1 mm, in view of considering the in-plane temperature uniformity in the wafer. Further, a pitch P1 of the wire materials 80 is preferably controlled to be set to about a few mm. In any case, it is preferable to provide a large number of small coupling protrusions 78 or punch holes 74 to improve the in-plane temperature uniformity in the wafer.

As can be seen from FIG. 2, a conductive line 82 is connected to the central portion of the heat-equalizing member 40. The conductive line 82 extends downward inside the supporting column 30. Further, the conductive line 82 penetrates the flange 58 of the supporting column 30 via an insulating sealing member 84, and extends further downward. In addition, a high frequency bias power supply 86 is connected to a lower portion of the conductive line 82. Accordingly, the heat-equalizing member 40 can serve as a lower electrode as well. A frequency of the high frequency power supply 86 is, e.g., 13.56 MHz.

Besides, when the conductive line 82 is grounded, the conductive line 82 can be used as an earth line without using the high frequency power supply 86. When the conductive line 82 is grounded, the heat-equalizing member 40 can serve as a shield for preventing a discharge from the resistance heater 38 with respect to a high frequency wave (plasma).

Power feed lines 90 are connected to end portions of the resistance heater 38 of the mounting table 32. The power feed lines 90 extend downward from the center of the backside of the mounting table 32. A part of the power feed lines 90 in a longitudinal direction thereof is airtightly sealed inside a line sealing pipe 92 made of a heat-resistant and corrosion-resistant material.

An upper end portion of the line sealing pipe 92 is welded together with the lower plate 64 of the mounting table 32. As a result, the line sealing pipe 92 penetrates the cylindrical supporting column 30 and extends downward. Although there are actually provided a plurality of line sealing pipes 92, only one is shown for simplicity in FIGS. 1 and 2.

The power feed lines 90 penetrate the flange 58 of the supporting column 30 via the insulating sealing member 94 and extend further downward. Moreover, a heater power supply 96 is connected to the lower portion of the power feed lines 90. As described above, temperature in each region of the resistance heater 38 can be controlled independently by the heater power supply 96.

In this embodiment, the conductive line 82 of the high frequency power is inserted in the supporting column 30 to pass therethrough as described above and, therefore, in order to avoid the occurrence of discharge between itself and another line, the atmosphere in the supporting column 30 needs to be set to a state that prevents the discharge. To be specific, the inside of the supporting column 30 needs to be set to a vacuum state where a discharge by a high frequency voltage does not occur, or maintained at a predetermined pressure by sealing an inert gas such as Ar gas or $N_2$ gas therein at a predetermined pressure or by constantly introducing an inert gas from the outside.

Besides, although it is not illustrated, a temperature measuring thermocouple is embedded in the center of the bottom portion of the mounting table 32. The measured value is used for a temperature control.

Hereinafter, an operation of the above configured heat treatment apparatus using the plasma will be explained. Above all, a semiconductor wafer W to be processed is loaded into the processing chamber 4 by a transfer arm (not shown) via the open gate valve 18 and the loading/unloading port 16. Next, the wafer W is transferred on top of the upthrust pins 46 that have been lifted. Thereafter, the upthrust pins 46 are lowered, so that the wafer W is mounted on the top surface of the mounting table 32.

Next, various processing gases, e.g., a film forming gas and the like, are supplied to the shower head 6 at respective controlled flow rates. These gases are injected through the gas injection holes 10A and 10B and then introduced into the processing space S. Further, a vacuum pump (not shown) provided at the exhaust line 36 is kept operating continuously to maintain the vacuum state in the processing chamber 4 and the exhaust gas downdraft space 22. At this time, by controlling an opening degree of the pressure control valve, the atmosphere of the processing space S can be maintained at a predetermined processing pressure.

At this time, the temperature of the wafer W is maintained at a predetermined process temperature. That is, the resistance heater 38 of the mounting table 32 is heated by a voltage applied thereto from the heater power supply 96 and, thus, the entire mounting table 32 is heated. As a result, the wafer W mounted on the mounting table 32 is heated. At this time, a wafer temperature is measured by the thermocouple (not shown) provided in the mounting table 32. Based on the measured value, the temperature in each region is controlled independently.

At the same time, the high frequency power supply 17 is driven in order to perform the plasma processing. Therefore, a high frequency power is applied between the shower head 6 as an upper electrode and the mounting table 32 as a lower electrode. Accordingly, a plasma is generated in the processing space S, and a predetermined plasma processing is carried out. Moreover, the plasma ions can be attracted by applying a high frequency power from the high frequency bias power supply 86 to the heat-equalizing member 40 of the mounting table 32.

In a conventional heat treatment apparatus, the heat-equalizing plate is provided as a separate member on the mounting table. In that case, a film forming gas or the like flows into the narrow gap between the heat-equalizing plate and the mounting table, so that an unnecessary attachment film causing particles or the like is deposited thereon. In this embodiment, however, the heat-equalizing member 40 is embedded as a unit in the mounting table 32 and, thus, the wafer W is directly mounted on the mounting table 32. Accordingly, the deposition of an unnecessary attachment film can be prevented, unlike in the conventional apparatus. Further, the heat generated from the resistance heater 38 is diffused in a planar direction by the heat-equalizing member having high emissivity, and thus can be transferred to the wafer W effectively. That is, in accordance with this embodiment, the in-plane temperature uniformity in the wafer can be maintained at a high level while preventing a deposition of an unnecessary attachment film.

As for a heat source for heating the wafer W and the mounting table 32, the plasma generated in the processing space S can be used in addition to the resistance heater 38. The heat transferred from the plasma to the wafer W is also diffused in a planar direction by the heat-equalizing member 40, which further increases the in-plane temperature uniformity in the wafer.

As set forth above, since the wafer W is directly mounted on the mounting table 32, the thermal conductivity between the two members increases and, hence, the heating efficiency of the wafer can be enhanced. Moreover, the heat-equalizing member 40 can serve as a lower electrode due to its conductivity, so that the plasma processing can be carried out by supplying the high frequency power.

In the above embodiment, there has been described the case where the wire materials 80 are made of carbon fibers as an example. However, instead, a wire net-shaped metal mesh made of metal wires can be used as the heat-equalizing member 40. In that case, the same effects obtained by using carbon fibers can be obtained except that the in-plane temperature uniformity in the wafer reduces slightly.

Further, in the above embodiment, the coupling protrusions 78 are formed on the top surface of the upper plate 68 of the mounting table 32. However, the coupling protrusions 78 can be formed on the bottom surface of the uppermost plate 70 without being limited to the above embodiment. Or, the coupling protrusions 78 can be provided both on the bottom surface of the uppermost plate 70 and the top surface of the upper plate 68.

(First Modification)

In the above embodiment, the heat treatment apparatus using a plasma has been described as an example. However, the present invention is not limited thereto, and can be applied to heat treatment apparatus which does not use a plasma.

Figure 5:
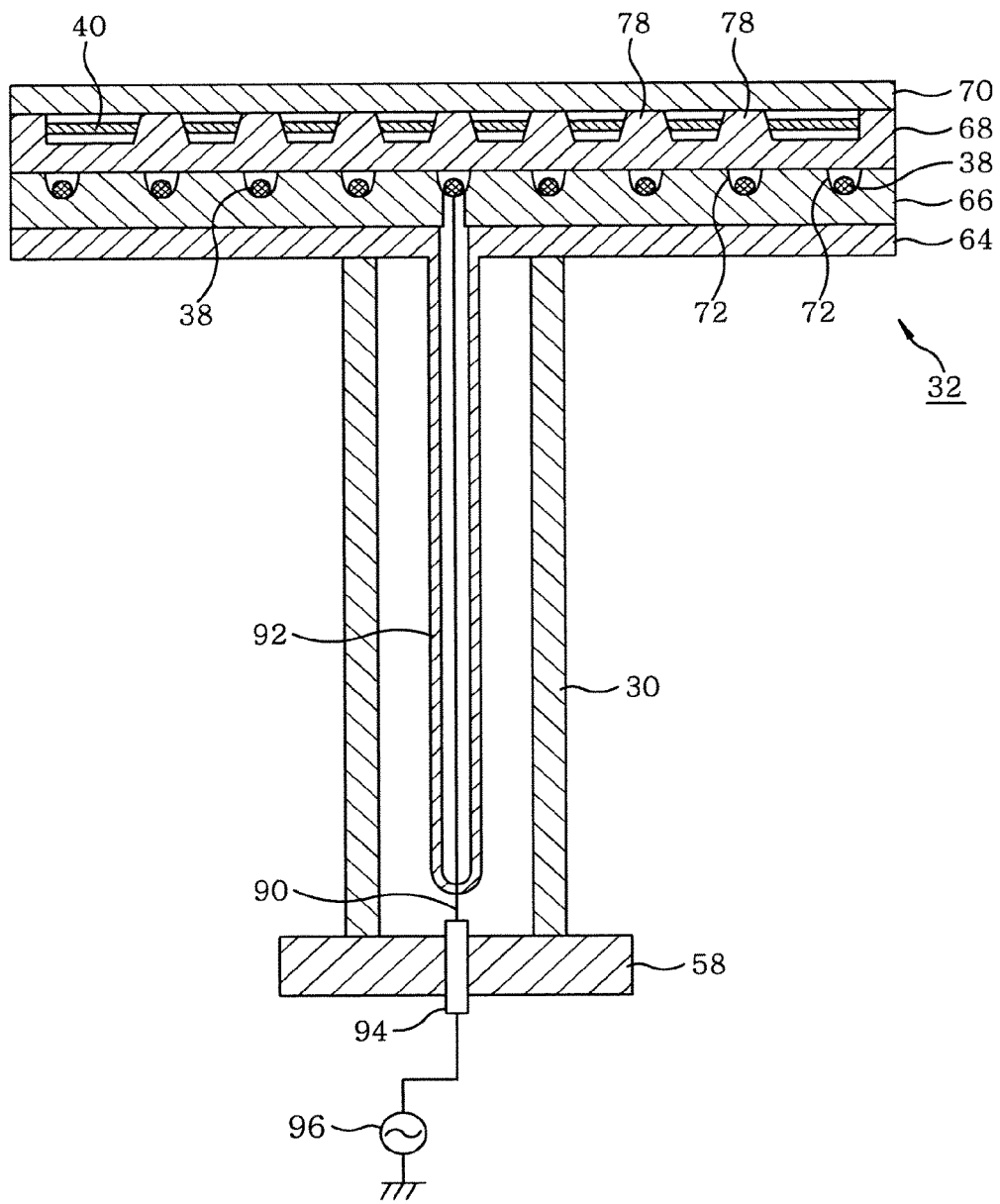
FIG. 5 offers a schematic cross sectional view of a first modification of the mounting table structure in accordance with the present invention.

FIG. 5 offers a schematic cross sectional view of a mounting table structure (first modification). Here, like reference numerals will be used for like parts identical to those described in FIG. 2, and redundant description thereof will be omitted.

In this modification, the high frequency power is not used, so that it is unnecessary to provide the conductive line 82 and the high frequency bias power supply 86 which are required in the structure shown in FIG. 2. Meanwhile, a heat-equalizing member 40 of this modification can be made of the same material, e.g., carbon or semiconductor, which is described in FIG. 2. Especially, since the high frequency power is not used in this embodiment, the heat-equalizing member 40 need not be conductive to the high frequency. Therefore, the heat-equalizing member 40 can be made of a material having high thermal conductivity without considering electrical conductivity.

Further, the atmosphere in the supporting column 30 need not be controlled in a manner that prevents the high frequency discharge. Furthermore, the heat treatment apparatus of the modification does not require the high frequency power supply 17 for plasma generation and the related components used in the heat treatment apparatus of FIG. 1.

The first modification can provide the same effects as those provided by the mounting table structure of FIG. 2 except the effects related to such high frequency.

Especially, the mounting table structure of this modification is suitable for a thermal CVD process which does not use a plasma or for a so-called ALD film forming process for depositing thin films on a single layer basis by alternately supplying a plurality of film forming gases.

(Second Modification)

In the above embodiment, it is difficult to quickly cool the temperature of the mounting table 32 due to high heat capacity of quartz. Therefore, in order to perform the cooling quickly, a coolant channel is provided in the mounting table 32.

Figure 6:
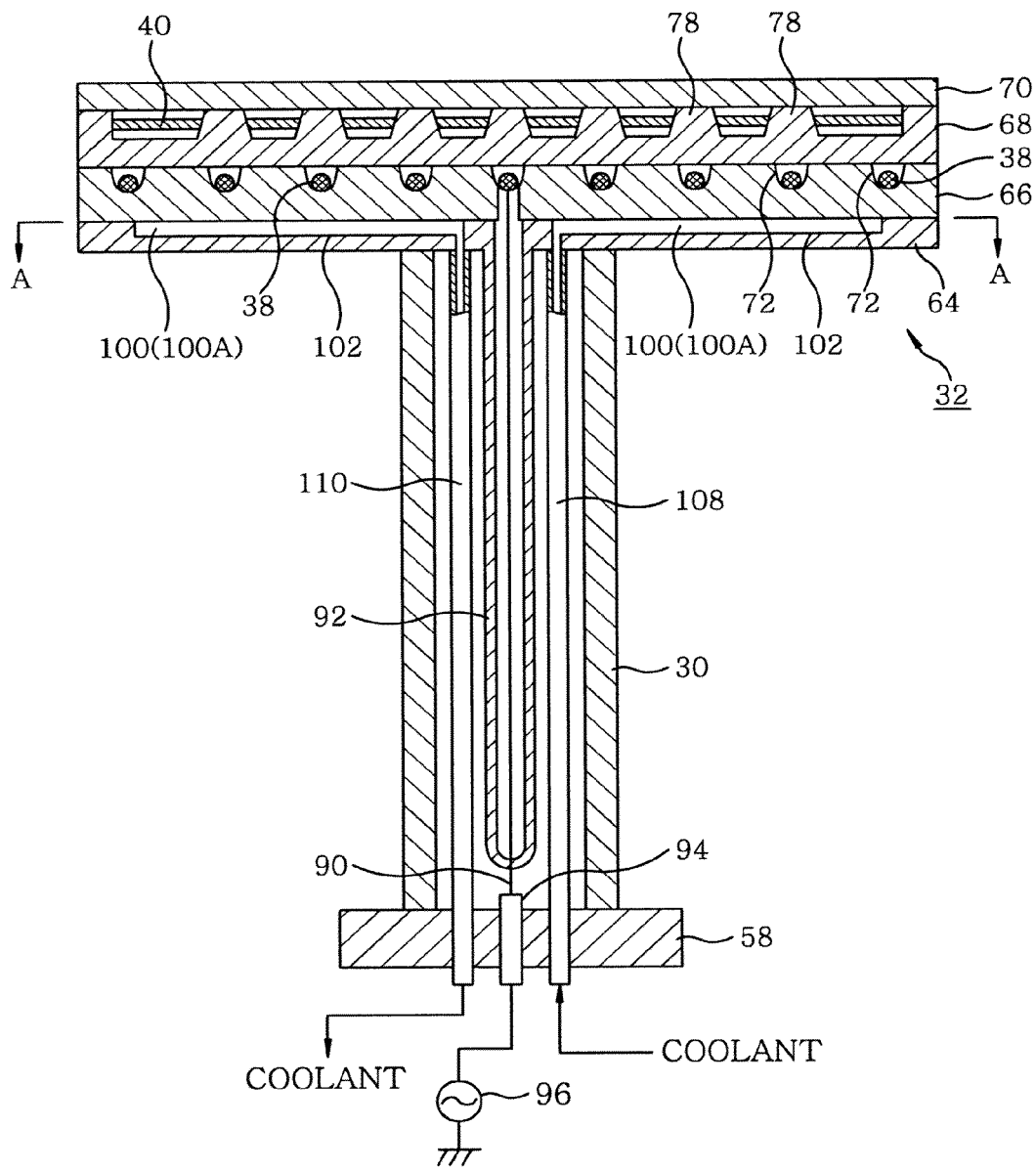
FIG. 6 presents a schematic cross sectional view of a second modification of the mounting table structure in accordance with the present invention.
Figure 7:
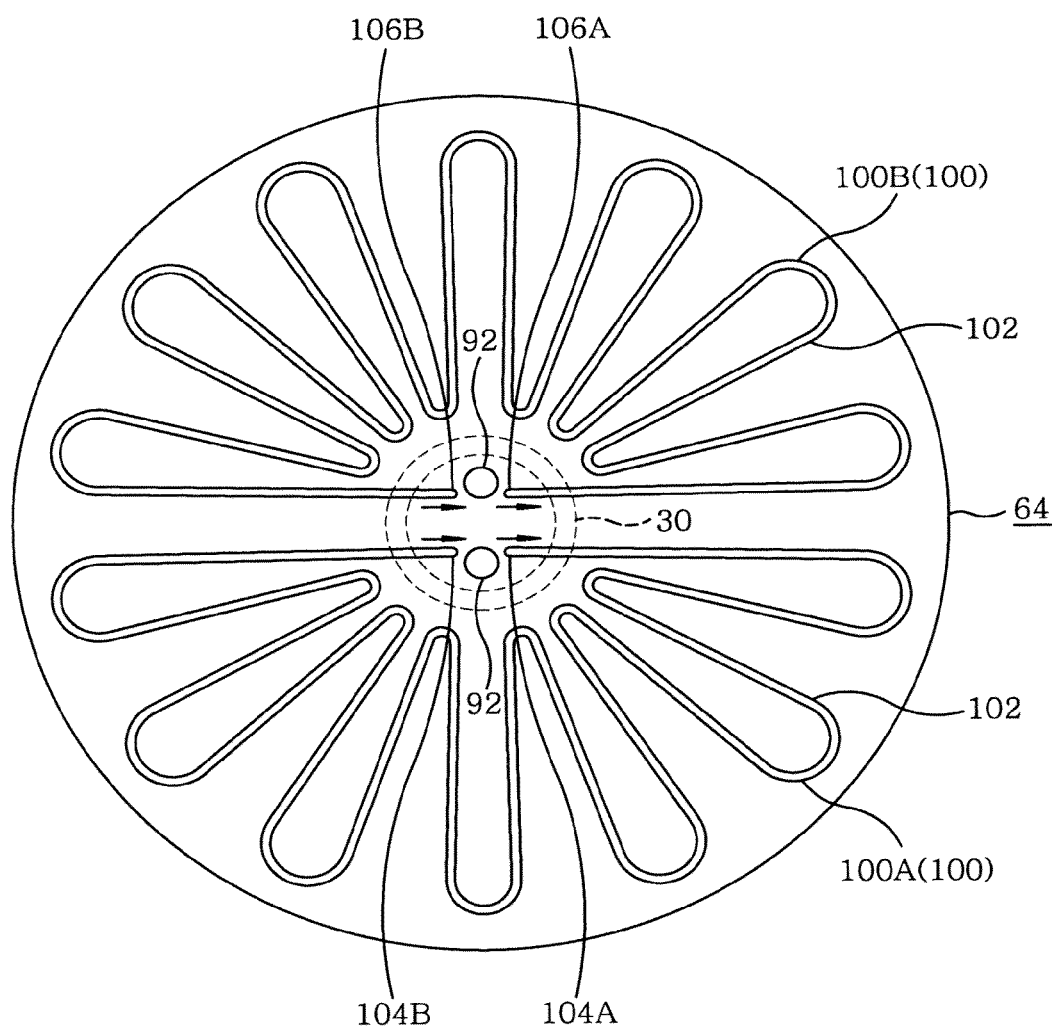
FIG. 7 depicts a cross section taken along line A-A of FIG. 6.

FIG. 6 presents a schematic cross sectional view of a mounting table structure (second modification), and FIG. 7 depicts a cross section taken along line A-A of FIG. 6. Here, like reference numerals will be used for like parts identical to those described in FIGS. 2 and 5, and redundant description thereof will be omitted. In this example, a coolant channel is provided in the mounting table structure of FIG. 5. However, a coolant channel can be provided in the mounting table structure of FIG. 2.

As shown in FIGS. 6 and 7, in the second modification, a coolant channel 100 for supplying a coolant when necessary is formed substantially on the entire mounting table 32 in a planar direction. To be specific, the coolant channel 100 is formed by providing coolant grooves 102 substantially on the entire top surface of the lower plate 64 of the mounting table 32, the coolant grooves 102 being formed by a plurality of linear parts extending in a radial direction and circular arc-shaped parts connecting two adjacent linear parts. Although a pattern of the coolant channel 100 is not particularly limited, the coolant channel 100 of this modification is divided into two semicircular coolant channels 100A and 100B, as can be seen from FIG. 7.

As depicted in FIG. 7, coolant inlets 104A and 106A and coolant outlets 104B and 106B of the coolant channels 100A and 100B are formed at the central portion of the lower plate 64. A coolant line 108 extending inside the supporting column 30 is connected to the coolant inlets 104A and 106A. A lower part of the coolant line 108 airtightly penetrates the flange 58 of the supporting column 30, and extends to the outside of the supporting column 30. Meanwhile, a coolant line 110 extending inside the supporting column 30 is connected to the coolant outlets 104B and 106B. A lower part of the coolant line 110 airtightly penetrates the flange 58 of the supporting column 30, and extends to the outside of the supporting column 30. In FIG. 6, two coolant lines 108 and 110 are illustrated.

Accordingly, the mounting table 32 can be effectively cooled by supplying a coolant in the coolant channel 100 when necessary.

As for a coolant, it is possible to use liquid or gas, e.g., cooled nitrogen or helium gas. Especially, as for liquid, it is possible to use Galden (registered trademark), fluorine-based heat transfer medium or cooling water.

As described above, the mounting table 32 and the wafer W can be quickly cooled to a required temperature by circulating a coolant through the coolant channel 100 formed in the mounting table 32 when necessary. For example, when the maintenance of the heat treatment apparatus is performed, the mounting table 32 needs to be cooled to about 70° C. for safety. In that case, it is possible to quickly cool the mounting table 32 to about 70° C., so that the maintenance can be quickly performed.

When a cleaning operation using a cleaning gas is performed after the film formation is carried out at a high temperature, the cleaning gas needs to be supplied after the processing chamber and the mounting table 32 are cooled to a predetermined temperature. In this case as well, the mounting table 32 can be quickly cooled to a predetermined temperature as described above, so that the cleaning process can be quickly carried out.

Moreover, depending on types of wafer treatment, the processing may be performed consecutively in regions where different processing temperatures are required. In this case as well, the mounting table 32 can be quickly cooled to a predetermined temperature when a step is shifted to a next step which requires a lower processing temperature. As a result, the throughput can be improved.

The quartz glass forming the mounting table 32 is especially strong against thermal impact. Therefore, the mounting table 32 itself is not damaged even if the coolant circulates through the coolant channel 100.

As for the coolant, gas and liquid can be alternately used depending on the temperature of the mounting table 32. For example, when the mounting table 32 has a high temperature, cooling gas is made to flow to thereby suppress the thermal impact applied to the mounting table 32. Next, when it is cooled to a predetermined temperature, e.g., about 200° C., cooling liquid of high heat capacity is made to flow, thus increasing a cooling speed.

Here, the coolant grooves 102 forming the coolant channel 100 are formed on the top surface of the lower plate 64. However, the coolant grooves 102 may be provided on the bottom surface of the middle plate 66 or both on the bottom surface of the middle plate 66 and the top surface of the lower plate 64, without being limited to the above example.

Although the supporting column 30 is formed in a cylindrical shape with hollow inner space in the above description, it is not limited thereto. For example, a supporting column 30 formed as solid quartz glass column can also be used. In that case, long and thin through holes are formed in the supporting column 30 formed as a solid quartz glass column by a drill or the like, and the corresponding through holes can be used as the coolant lines 108 and 110.

In the above embodiment, there has been described the case where the mounting table 32 is formed by coupling the four glass plates 64, 66, 68 and 70. However, the mounting table 32 can be formed by three glass plates which do not include the lower plate 64, or by five or more glass plates.

Moreover, although the film forming process has been described in the above embodiment, the thermal treatment is not limited thereto. That is, the present invention can be applied to a heat treatment apparatus for performing any treatment. The present invention is especially suitable for a heat treatment apparatus using corrosion gas.

In the above embodiment, there has been described the case where the mounting table structure is made of a heat-resistant and corrosion-resistant material such as quartz glass. However, the mounting table structure can be made of ceramic such as AlN, Al$_2$O$_3$, SiC or the like without being limited to the above example. Especially, it is preferable that the entire mounting table structure is made of the same material in view of considering manufacturing processes, thermal impact or the like.

Further, although a semiconductor wafer is used as an example of a target object in the above embodiment, it is not limited thereto. An LCD substrate, a glass substrate or the like can also be used as a target object.

What is claimed is:

1. A mounting table structure arranged in a processing chamber, comprising:
    a mounting table for mounting a target object on an upper surface thereof, in which a heating unit is embedded for heating the target object to perform a specified heating treatment; and
    a supporting column for supporting the mounting table, the supporting column being standing on a bottom portion of the processing chamber,
    wherein a heat-equalizing member spread in a planar direction is embedded above the heating unit in the mounting table, and
    wherein the heat-equalizing member is formed of a plurality of wires arranged in a mesh shape, and materials forming the mounting table are projected and coupled to each other in net hole-shaped portions formed by the wires.

2. A mounting table structure arranged in a processing chamber, comprising:
    a mounting table for mounting a target object on an upper surface thereof; and
    a supporting column for supporting the mounting table, the supporting column being standing on a bottom portion of the processing chamber,
    wherein a heat-equalizing member spread in a planar direction is embedded in the mounting table, the heat-equalizing member being made of a material conductive to high frequency,
    wherein a conductive line is connected to the heat-equalizing member, and
    wherein the conductive line is inserted in the supporting column.

3. The mounting table structure of claim 2, wherein a heating unit spread in a planar direction is embedded below the heat-equalizing member in the mounting table.

4. A mounting table structure arranged in a processing chamber, comprising:
    a mounting table for mounting a target object on an upper surface thereof, in which a heating unit is embedded for heating the target object to perform a specified heating treatment; and
    a supporting column for supporting the mounting table, the supporting column being standing on a bottom portion of the processing chamber,
    wherein a heat-equalizing member spread in a planar direction is embedded above the heating unit in the mounting table, and
    wherein the heat-equalizing member is formed as a punch plate where a plurality of punch holes are formed, and materials forming the mounting table are projected and coupled to each other in the punch holes.

5. The mounting table structure of any one of claims 1, 2 and 4, wherein the heat-equalizing member is made of carbon or a semiconductor material.

6. The mounting table structure of claim 2, wherein the supporting column is formed in a cylindrical shape, and an inner space of the supporting column is filled with the atmosphere where a high frequency discharge is prevented.

7. The mounting table structure of claim 1 or 4, wherein the mounting table has on an entire surface thereof a coolant channel through which a coolant for cooling the mounting table flows, and a coolant line is provided in the supporting column for supplying the coolant to the coolant channel.

8. The mounting table structure of claim 1 or 4, wherein the mounting table and the supporting column are made of a heat-resistant and corrosion-resistant insulating material.

9. The mounting table structure of claim 8, wherein the heat-resistant and corrosion-resistant material is quartz glass or ceramic.

10. The mounting table structure of claim 7, wherein the coolant is gas or liquid.

11. The mounting table structure of claim 7, wherein as for the coolant, gas and liquid are alternately used depending on a temperature of the mounting table.

12. A heat treatment apparatus comprising:
    a vacuum evacuable processing chamber;
    the mounting table structure described in claim 1 or 4; and
    a gas supply unit for supplying a specified processing gas to the processing chamber.

13. The heat treatment apparatus of claim 12, wherein the processing chamber has therein an electrode connected to a high frequency power for generating a plasma.

* * * * *